US012757338B2

(12) United States Patent
Yan et al.

(10) Patent No.: US 12,757,338 B2
(45) Date of Patent: Oct. 6, 2026

(54) ELECTRONIC DEVICE

(71) Applicant: Honor Device Co., Ltd., Shenzhen (CN)

(72) Inventors: Bin Yan, Shenzhen (CN); Zhenrui Tang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 74 days.

(21) Appl. No.: 18/993,842

(22) PCT Filed: Nov. 23, 2023

(86) PCT No.: PCT/CN2023/133741

§ 371 (c)(1),
(2) Date: Jan. 13, 2025

(87) PCT Pub. No.: WO2024/148966

PCT Pub. Date: Jul. 18, 2024

(65) Prior Publication Data

US 2026/0020167 A1 Jan. 15, 2026

(30) Foreign Application Priority Data

Jan. 12, 2023 (CN) ......................... 202310071873.0

(51) Int. Cl.
*H01Q 1/22* (2006.01)
*G06F 1/16* (2006.01)
(Continued)

(52) U.S. Cl.
CPC ......... *H05K 5/0217* (2013.01); *G06F 1/1656* (2013.01); *G06F 1/1698* (2013.01);
(Continued)

(58) Field of Classification Search
CPC ....... G06F 1/1656; G06F 1/1698; H01Q 1/22; H01Q 1/2258
See application file for complete search history.

(56) References Cited

U.S. PATENT DOCUMENTS 10,581,153 B2 * 3/2020 Edwards .............. H05K 5/0247
12,401,735 B2 * 8/2025 Yan ........................ H05K 1/115
(Continued)

FOREIGN PATENT DOCUMENTS

CN 2809944 Y * 8/2006
CN 101079651 B * 11/2014
(Continued)

*Primary Examiner* — Adrian S Wilson
(74) *Attorney, Agent, or Firm* — Conley Rose, P.C.

(57) ABSTRACT

This application provides an electronic device, and relates to the field of electronic device technologies. The electronic device includes a housing, a mainboard, and a spring plate. The housing includes a bezel and a back cover, and the back cover is fixedly connected to the bezel. The mainboard is disposed in the housing. The spring plate includes a welding portion and a contact portion, where the welding portion is bonded to and fixed, by welding, to the bezel, and the contact portion is electrically connected to the mainboard. The contact portion is parallel to the mainboard, an included angle α is formed between the welding portion and the contact portion, and the included angle α is an obtuse angle or an acute angle.

20 Claims, 8 Drawing Sheets

(51) Int. Cl.

| | |
|---|---|
| ***H04M 1/02*** | (2006.01) |
| ***H05K 5/00*** | (2006.01) |
| ***H05K 5/02*** | (2006.01) |
| ***H05K 5/03*** | (2006.01) |

(52) U.S. Cl.

CPC ............ *H01Q 1/22* (2013.01); *H04M 1/0249* (2013.01); *H04M 1/0277* (2013.01); *H05K 5/0086* (2013.01); *H05K 5/0247* (2013.01); *H05K 5/03* (2013.01)

(56) References Cited

U.S. PATENT DOCUMENTS

| | | | | |
|---|---|---|---|---|
| 12,562,462 | B2 * | 2/2026 | Xue | H01Q 1/243 |
| 2013/0257659 | A1 * | 10/2013 | Darnell | H05K 1/028 343/702 |
| 2015/0229365 | A1 * | 8/2015 | Qiu | H04B 1/18 375/267 |
| 2016/0064810 | A1 * | 3/2016 | Smith | H01Q 1/243 439/862 |
| 2016/0072178 | A1 * | 3/2016 | Khalifa | H01Q 1/36 343/702 |
| 2020/0081488 | A1 * | 3/2020 | Baker | H05K 1/0215 |
| 2021/0075090 | A1 * | 3/2021 | Yarga | H01Q 1/241 |
| 2022/0407218 | A1 | 12/2022 | Guo et al. | |
| 2023/0131026 | A1 * | 4/2023 | Kim | H04M 1/0274 361/679.01 |
| 2024/0380832 | A1 | 11/2024 | Jingbo et al. | |

FOREIGN PATENT DOCUMENTS

| | | | | |
|---|---|---|---|---|
| CN | 204990235 | U | | 1/2016 |
| CN | 213585867 | U | | 6/2021 |
| CN | 213753021 | U | | 7/2021 |
| CN | 217009639 | U | * | 7/2022 |
| CN | 115036717 | A | | 9/2022 |
| CN | 115225745 | A | | 10/2022 |
| CN | 115332785 | A | | 11/2022 |
| CN | 218243565 | U | | 1/2023 |
| CN | 218276765 | U | | 1/2023 |
| EP | 1001486 | B1 | | 9/2003 |
| KR | 20140025065 | A | | 3/2014 |
| WO | 2022186590 | A1 | | 9/2022 |

* cited by examiner

ELECTRONIC DEVICE

CROSS-REFERENCE TO RELATED APPLICATIONS

This is a U.S. National Stage of International Application No. PCT/CN2023/133741 filed on Nov. 23, 2023, which claims priority to Chinese Patent Application No. 202310071873.0, filed with the China National Intellectual Property Administration on Jan. 12, 2023, both of which are incorporated herein by reference in their entireties.

TECHNICAL FIELD

This application relates to the field of electronic device technologies, and in particular, to an electronic device.

BACKGROUND

A mainboard in an inside of an electronic device is usually electrically connected to a metal portion by using a spring plate. The spring plate and the metal portion are electrically connected through welding. Because existing electronic devices increasingly tend to be lighter and thinner, a thickness dimension of the electronic device is relatively small, and an internal thickness space is limited. However, the thickness space cannot meet an existing requirement of a welding dimension between the spring plate and the metal portion. Therefore, the thickness dimension of the electronic device needs to be increased, affecting lightness and thinning of the electronic device.

SUMMARY

Embodiments of this application provide an electronic device, to resolve a problem that an internal thickness space of the electronic device cannot meet a requirement of a welding length between a spring plate and a metal portion.

To achieve the foregoing objective, the following technical solutions are used in embodiments of this application.

An embodiment of this application provides an electronic device. The electronic device includes a housing, a mainboard, and a spring plate. The housing includes a bezel and a back cover, and the back cover is fixedly connected to the bezel. The mainboard is disposed in the housing. The spring plate includes a welding portion and a contact portion, where the welding portion is bonded to and fixed, by welding, to the bezel, and the contact portion is electrically connected to the mainboard. The contact portion is parallel to the mainboard, an included angle $\alpha$ is formed between the welding portion and the contact portion, and the included angle $\alpha$ is an obtuse angle or an acute angle.

According to the electronic device provided in this embodiment of this application, the angle is formed between the welding portion and the contact portion, and the contact portion is parallel to the mainboard, that is, the welding portion is obliquely disposed. Therefore, according to the principle that a hypotenuse of a right triangle is the longest, a length of bonding and welding between the welding portion and the bezel can be increased without increasing a height of the welding portion in a direction perpendicular to the mainboard. In this way, there is no need to increase a thickness dimension of the electronic device, and the internal thickness space can meet a requirement of a welding dimension between the spring plate and the bezel.

In some embodiments of this application, the welding portion is provided on a side of the contact portion close to the back cover. With this structure, only an inclined surface used to be bonded to the welding portion needs to be processed on the bezel. Therefore, this helps reduce processing difficulty.

In some embodiments of this application, the included angle $\alpha$ formed between the welding portion and the contact portion is the obtuse angle. In this way, the welding portion can be prevented from conflicting with some electronic components inside the electronic device, and the welding portion can be prevented from occupying space inside the housing. This helps improve overall space utilization.

In some embodiments of this application, the included angle $\alpha$ is 120°, 135°, or 150°. That is, an acute angle formed between the welding portion and a plane parallel to the mainboard is 30°, 45°, or 60°. The angle is a conventional processing angle. On the one hand, this helps reduce processing difficulty, and on the other hand, this helps improve processing precision.

In some embodiments of this application, in a direction in which the contact portion points toward the welding portion and is parallel to the welding portion, a length of the welding portion that is bonded to and fixed, by welding, to the bezel is L, and $1.0\ \text{mm} \leq L \leq 1.2\ \text{mm}$. In this way, a requirement of a welding dimension between the welding portion and the bezel can be ensured, so that welding strength between the two can be ensured.

In some embodiments of this application, a gap exists between an edge of the welding portion away from the contact portion and the back cover. Through the gap, the back cover can be prevented from abutting against the spring plate, thereby avoiding damage caused by the two abutting against each other.

In some embodiments of this application, the gap between the edge of the welding portion away from the contact portion and the back cover is D, and $0.1\ \text{mm} \leq D \leq 0.2\ \text{mm}$.

In some embodiments of this application, the bezel includes a metal portion and a plastic portion. The welding portion of the spring plate is bonded to and fixed, by welding, to the metal portion of the bezel. The contact portion of the spring plate is fixed to the plastic portion of the bezel. At least one notch is formed on an outer wall of the metal portion, and a part of the plastic portion extends into the notch. In this way, the plastic portion extends into the notch, so that avoidance can be formed for the antenna, thereby ensuring a clearance area of the antenna and avoiding affecting a signal of the antenna.

In some embodiments of this application, the bezel further includes a reinforcing block. The reinforcing block is embedded in the plastic portion. The reinforcing block is configured to reinforce strength at the notch on the metal portion. The reinforcing block is disposed at a position corresponding to the notch, and is embedded in the plastic portion, to improve strength at the notch of the metal portion, thereby helping improve overall strength of the bezel.

In some embodiments of this application, a vertical projection of the reinforcing block on the back cover coincides with at least part of an area of a vertical projection of the spring plate on the back cover. That is, an area of an electrical connection between the mainboard and the metal portion overlaps an area in which the reinforcing block is located. Therefore, the spring plate may also be disposed in the area.

In some embodiments of this application, the reinforcing block is disposed on a side of the spring plate away from the back cover. The welding portion of the spring plate is obliquely disposed. Therefore, the spring plate can be moved closer to the back cover, that is, a distance between the spring plate and the back cover is reduced. In this way, a thickness space on a side of the spring plate away from the back cover can be increased, and further a thickness dimension of the reinforcing block can be increased, thereby further improving strength of a middle frame.

In some embodiments of this application, the reinforcing block is disposed on a side of the spring plate close to the back cover. The reinforcing block is disposed between the spring plate and the back cover, so that the welding portion of the spring plate can be prevented from abutting against the back cover. This helps protect components intact.

In some embodiments of this application, the reinforcing block is made of a metal material. The metal material has high strength. Therefore, overall strength of the bezel can be improved.

In some embodiments of this application, the electronic device further includes an elastic piece. One end of the elastic piece is fixed to the mainboard, and the other end of the elastic piece abuts against the contact portion. That is, the mainboard is electrically connected to the spring plate by using the elastic piece, so that the mainboard forms a complete loop with the metal portion and the antenna.

Figure 1:
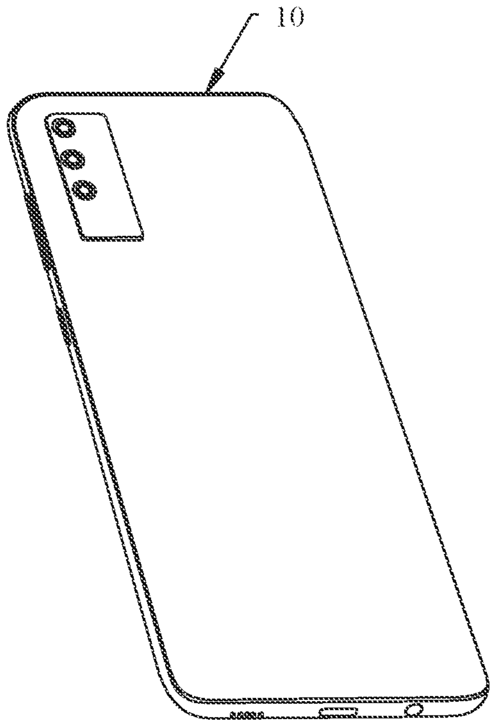
FIG. 1 is a diagram of a structure of an electronic device according to an embodiment of this application.

Reference numerals: 10—Electronic device; 100—Display module; 110—Light-transmitting cover plate; 120—Display; 200—Housing; 210—Back cover; 220—Bezel; 221—Metal portion; **221*a*—Notch; 222—Plastic portion; 223—Reinforcing block; 224—Accommodating groove; 224*a*—First portion; 224*b*—Second portion; 230—Middle plate; 300—Mainboard; 310—Elastic piece; 400—Spring plate; 410—Welding area; 420—Abutment area; 430—Welding portion; and 440**—Contact portion.

DESCRIPTION OF EMBODIMENTS

The technical solutions in embodiments of this application are described in the following with reference to the accompanying drawings in embodiments of this application. Apparently, the described embodiments are merely some rather than all of the embodiments of this application.

The terms "first" and "second" mentioned below are merely intended for a purpose of description, and shall not be understood as an indication or implication of relative importance or implicit indication of the quantity of indicated technical features. Therefore, a feature defined by "first" or "second" can explicitly or implicitly include one or more features.

In addition, in this application, position terms such as "upper" and "lower" are defined relative to an illustrative position in which a component is placed in the accompanying drawings. It should be understood that these direction terms are relative concepts and are used for relative description and clarification, and may vary accordingly depending on a change of the position in which the component is placed in the accompanying drawings.

In this application, unless otherwise explicitly specified or defined, the term "connection" should be understood in a broad sense. For example, the "connection" may be a fixed connection, a detachable connection or an integral connection; or may be a direct connection, or an indirect connection through an intermediary.

An embodiment of this application provides an electronic device. Specifically, the electronic device may be a portable electronic apparatus or another type of electronic apparatus. For example, the electronic device may be a mobile phone, a tablet personal computer (tablet personal computer), a laptop computer (laptop computer), a personal digital assistant (personal digital assistant, PDA), a monitor, a camera, a personal computer, a notebook computer, a wearable device, or the like. For ease of description, an example in which the electronic device is a mobile phone is described below.

Figure 2:
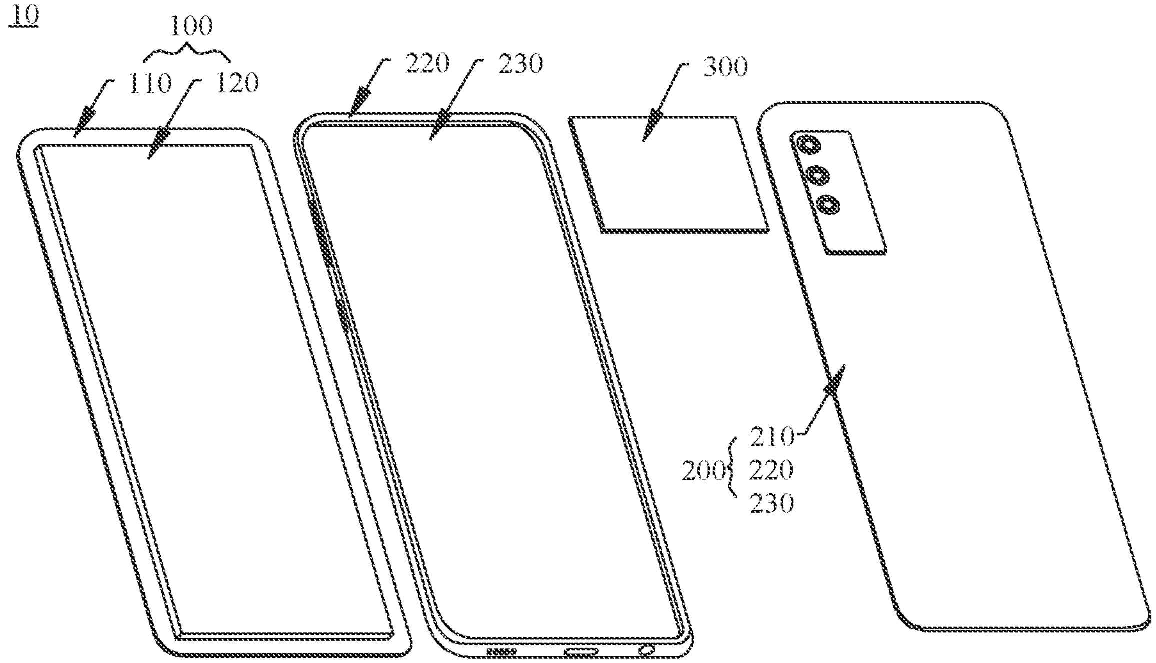
FIG. 2 is an exploded diagram of an electronic device according to an embodiment of this application.

Refer to FIG. 1 and FIG. 2. FIG. 1 is a diagram of a structure of an electronic device 10 according to an embodiment of this application. FIG. 2 is an exploded diagram of an electronic device 10 according to an embodiment of this application. It can be learned from the above that, in this embodiment, the electronic device 10 is a mobile phone, and the electronic device 10 may have an approximately rectangular plate shape. The electronic device 10 may include a display module 100, a housing 200, a mainboard 300, an antenna (not shown in the figure), and the like.

It may be understood that FIG. 1 and FIG. 2 only schematically show some components included in the electronic device 10, and actual shapes, actual sizes, actual positions, and actual structures of these components are not limited by FIG. 1 and FIG. 2.

The display module 100 is configured to display an image, a video, and the like. The display module 100 may include a light-transmitting cover plate 110 and a display 120 (English name: panel, also referred to as a display panel), and the light-transmitting cover plate 110 and the display

120 are disposed in a stacked manner. A material of the light-transmitting cover plate 110 includes but is not limited to glass. For example, an ordinary light-transmitting cover plate 110 may be used as the light-transmitting cover plate 110 to protect the display 120, to avoid damage to the display 120 caused by collision with an external force, and provide a dust prevention function. A light-transmitting cover plate 110 that has a touch control function may alternatively be used, to enable the electronic device 10 to have the touch control function, thereby making it more convenient for a user to use. Therefore, a specific material of the light-transmitting cover plate 110 is not particularly limited in this application.

In addition, a flexible display or a rigid display may be used as the display 120. For example, the display 120 may be an organic light-emitting diode (organic light-emitting diode, OLED) display, an active-matrix organic light-emitting diode (active-matrix organic light-emitting diode, AMOLED) display, a mini light-emitting diode (mini organic light-emitting diode) display, a micro light-emitting diode (micro organic light-emitting diode) display, a micro organic light-emitting diode (micro organic light-emitting diode) display, a quantum dot light-emitting diode (quantum dot light emitting diode, QLED) display, or a liquid crystal display (liquid crystal display, LCD).

The housing 200 is configured to protect electronic components inside the electronic device 10. The housing 200 may include a back cover 210 and a bezel 220. The back cover 210 is located on a side of the display 120 away from the light-transmitting cover plate 110. The back cover 210, the light-transmitting cover plate 110, and the display 120 are disposed at intervals in a stacked manner. The bezel 220 is located between the light-transmitting cover plate 110 and the back cover 210. The bezel 220 is fixed to the back cover 210. For example, the bezel 220 may be fixedly connected to the back cover 210 by gluing, screwing, welding, snapping, or the like. The bezel 220 and the back cover 210 may alternatively be an integrated structure, that is, the bezel 220 and the back cover 210 are a whole structural part. The light-transmitting cover plate 110 may be fixed to the bezel 220 by gluing, so that the light-transmitting cover plate 110, the back cover 210, and the bezel 220 enclose an internal accommodating space of the electronic device 10. The foregoing electronic components, for example, the mainboard 300 and a camera module, are disposed in the internal accommodating space.

In some embodiments, the housing 200 may further include a middle plate 230. The middle plate 230 is disposed in the internal accommodating space, and the middle plate 230 is located on a side of the display 120 away from the light-transmitting cover plate 110. The middle plate 230 is fixedly connected to the bezel 220 to form a middle frame of the electronic device 10. For example, the middle plate 230 may be fixedly connected to the bezel 220 by gluing, screwing, welding, snapping, or the like. The middle plate 230 and the bezel 220 may alternatively be an integrated structure, that is, the two are a whole structural part. The middle plate 230 divides the internal accommodating space into two mutually independent spaces, where one space is located between the light-transmitting cover plate 110 and the middle plate 230, and the display 120 is located in the space. The other piece is located between the middle plate 230 and the back cover 210, and the mainboard 300 is disposed in the space.

The mainboard 300 is configured to dispose electronic components inside the electronic device 10 and implement electrical connection between the electronic components. For example, the electronic component may be a control chip (for example, a system-level chip, System on Chip, SOC), a graphics control chip (graphics processing unit, GPU), a universal memory (universal flash storage, UFS), an earpiece, a flash module, and the like.

In addition, the mainboard 300 may be fixed to the middle plate 230 by gluing, welding, snapping, bolting, or the like. Therefore, a fixing manner of the mainboard 300 is not particularly limited in this application.

The foregoing antenna is configured to receive or transmit a signal for the electronic device 10. The antenna may include a communication antenna, a Bluetooth antenna, a Wi-Fi antenna, a GPS antenna, or the like. In addition, the antenna may be disposed inside the housing 200, or may be disposed on the bezel 220, that is, the antenna is a bezel 220 antenna.

Figure 3:
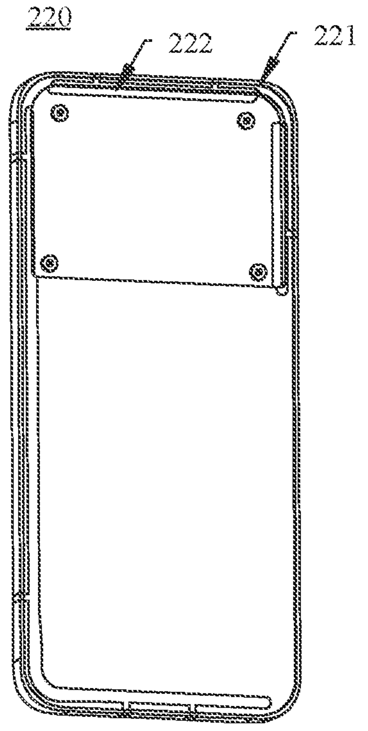
FIG. 3 is a diagram of a structure of a bezel according to an embodiment of this application.
Figure 4:
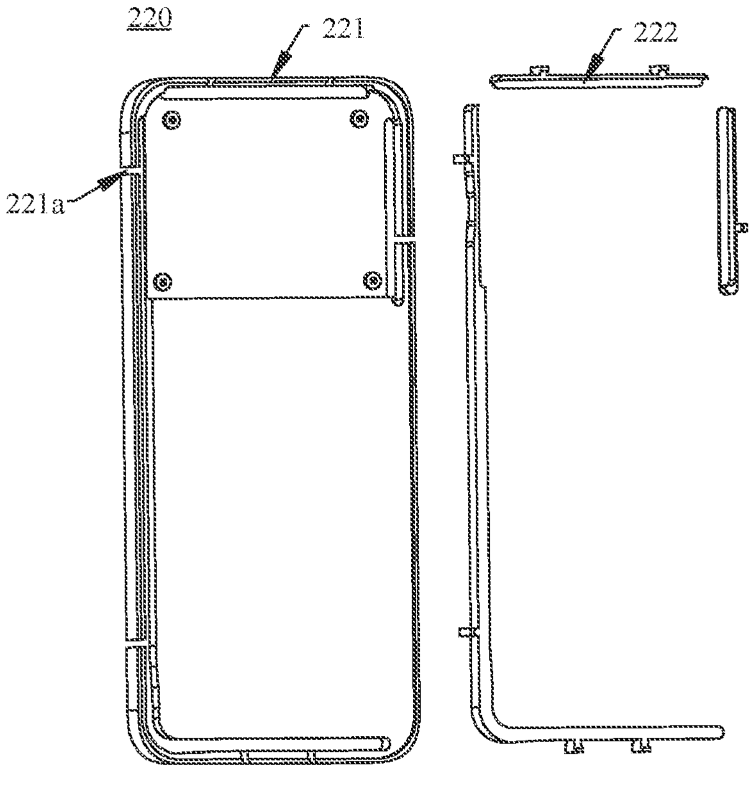
FIG. 4 is an exploded diagram of a bezel according to an embodiment of this application.

When the antenna is disposed on the bezel 220, to electrically connect the antenna and the mainboard 300 to each other, a closed loop is formed. Refer to FIG. 3 and FIG. 4. FIG. 3 is a diagram of a structure of a bezel 220 according to an embodiment of this application. FIG. 4 is an exploded diagram of a bezel 220 according to an embodiment of this application. The bezel 220 may include a metal portion 221 and a plastic portion 222. For example, the plastic portion 222 may be disposed on an inner side of the metal portion 221. At least one notch **221*a* is formed on an outer wall of the metal portion 221. The notches 221*a* are disposed in a one-to-one correspondence with antennas. A part of the plastic portion 222 is filled in the notch 221*a*. A signal sent by the antenna can be diffused outward through the notch 221*a*, to prevent the metal portion 221** from affecting signal transmission or reception.

It may be understood that a positional relationship between the plastic portion 222 and the metal portion 221 is only a possible application scenario. In some other scenarios, the metal portion 221 may alternatively be disposed on an inner side of the plastic portion 222. Therefore, this is not particularly limited in this application.

In addition, the antenna is disposed on the metal portion 221, and a spring plate 400 is welded to the metal portion 221. An elastic piece 310 is fixedly connected to the mainboard 300. By enabling the elastic piece 310 and the spring plate 400 to abut against each other, the mainboard 300 may be electrically connected to the metal portion 221, so that the mainboard 300 is electrically connected to the antenna.

Figure 5:
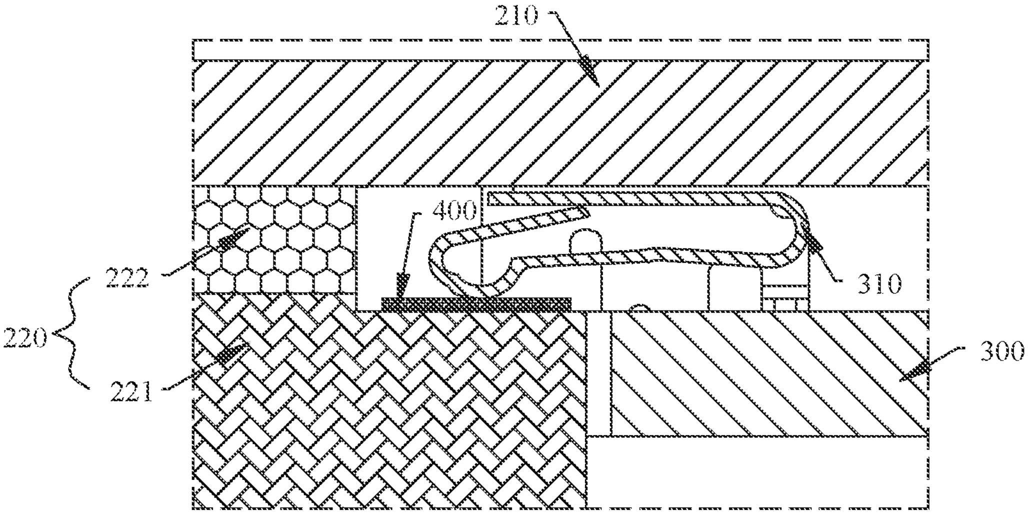
FIG. 5 is a partial cross-sectional view of a connection structure between a spring plate, a bezel, and a mainboard according to an embodiment of this application.

For example, refer to FIG. 5. FIG. 5 is a partial cross-sectional view of a connection structure between a spring plate 400, a bezel 220, and a mainboard 300 according to an embodiment of this application. The spring plate 400 may be of a flat plate structure. The spring plate 400 of the flat plate structure may be bonded to the metal portion 221 in a direction parallel to the middle plate 230 or the mainboard 300, and the elastic piece 310 abuts against a surface of the spring plate 400 facing the back cover 210, so that the mainboard 300 forms a closed loop with the metal portion 221 and the antenna.

Figure 6:
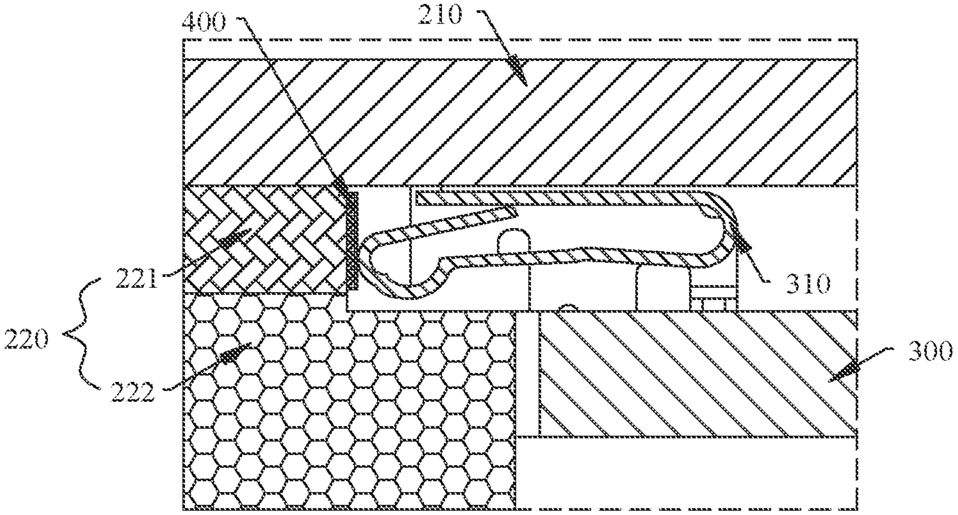
FIG. 6 is a partial cross-sectional view of another connection structure between a spring plate, a bezel, and a mainboard according to an embodiment of this application.

Alternatively, refer to FIG. 6. FIG. 6 is a partial cross-sectional view of another connection structure between a spring plate 400, a bezel 220, and a mainboard 300 according to an embodiment of this application. The spring plate 400 of the flat plate structure may alternatively be bonded to an inner wall of the metal portion 221 in a direction perpendicular to the mainboard 300, and the elastic piece 310 abuts against a surface of the spring plate 400 away from the metal portion 221, so that the mainboard 300 forms a closed loop with the metal portion 221 and the antenna.

Figure 7:
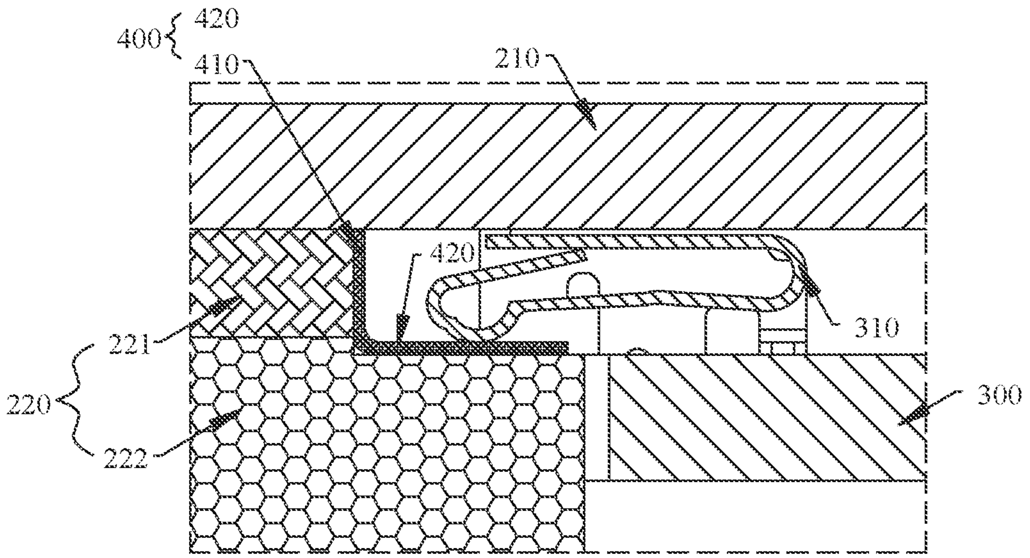
FIG. 7 is a partial cross-sectional view of still another connection structure between a spring plate, a bezel, and a mainboard according to an embodiment of this application.

Refer to FIG. 7. FIG. 7 is a partial cross-sectional view of still another connection structure between a spring plate 400, a bezel 220, and a mainboard 300 according to an embodiment of this application. The spring plate may alternatively be of an L-shaped structure. The spring plate 400 of the L-shaped structure may include a welding area 410 and an abutment area 420. The welding area 410 and the abutment area 420 are disposed perpendicular to each other, and the welding area 410 and the abutment area 420 are an integrated structure, that is, the two are one structural part. The welding area 410 is bonded to and fixed, by welding, to an inner wall of the metal portion 221 in a direction perpendicular to the mainboard 300. The abutment area 420 is fixedly connected to the plastic portion 222 in a direction parallel to the mainboard 300. For example, the plastic portion 222 may be fixedly connected to the abutment area 420 in a direction of fixing gluing. The elastic piece 310 abuts against a surface of the abutment area 420 away from the plastic portion 222, so that the mainboard 300 forms a closed loop with the metal portion 221 and the antenna.

However, when the spring plate 400 is welded to the metal portion 221, to meet a strength requirement, there is a requirement of a minimum welding length for a welding length between the two. In addition, since a requirement on the electronic device 10 (for example, a mobile phone) currently is to develop toward lightness and thinning, a welding requirement cannot be met.

Specifically, when the spring plate 400 of the flat plate structure is disposed in a direction perpendicular to the mainboard 300, or the spring plate 400 of the L-shaped structure is used, an internal thickness space of the housing 200 cannot meet a requirement of a minimum welding length for performing spot welding on the spring plate 400 and the metal portion 221, resulting in reduced electrical connection reliability.

When the spring plate 400 of the flat plate structure is disposed in a direction parallel to the mainboard 300, or the spring plate 400 of the L-shaped structure is moved away from the back cover 210, a clearance area of an antenna disposed on a side of the spring plate 400 away from the back cover 210 is reduced, affecting performance of the antenna.

Figure 8:
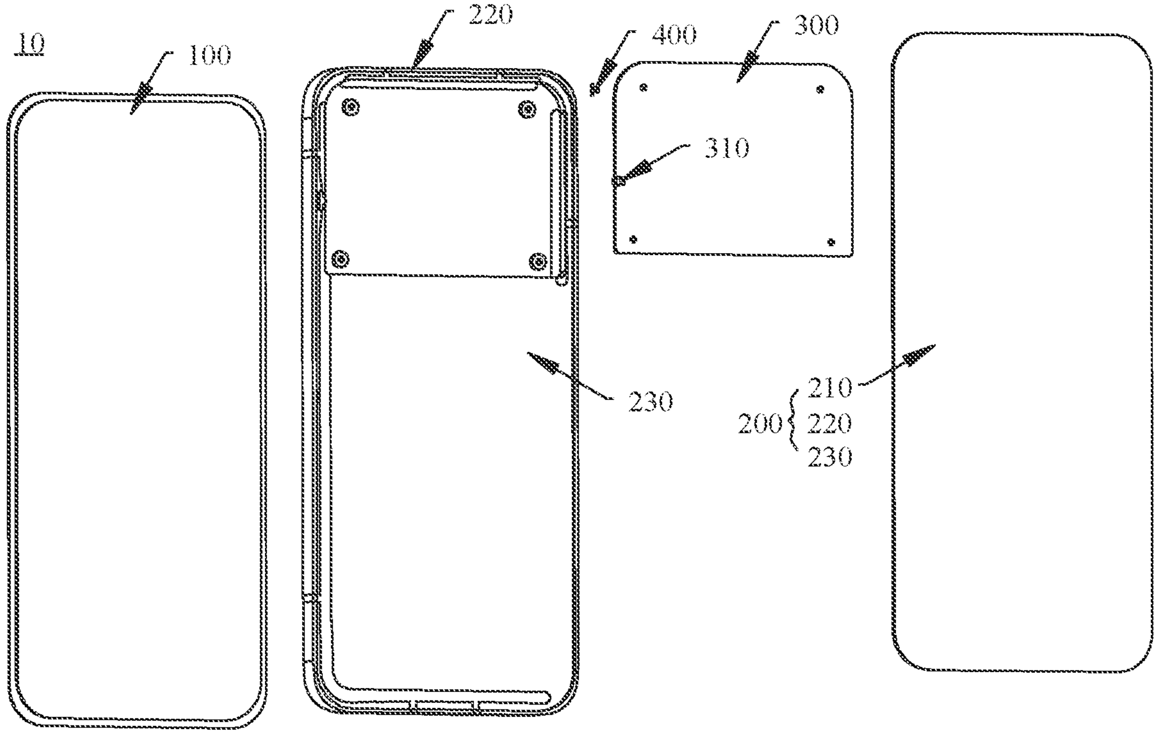
FIG. 8 is an exploded diagram of another electronic device according to an embodiment of this application.
Figure 9:
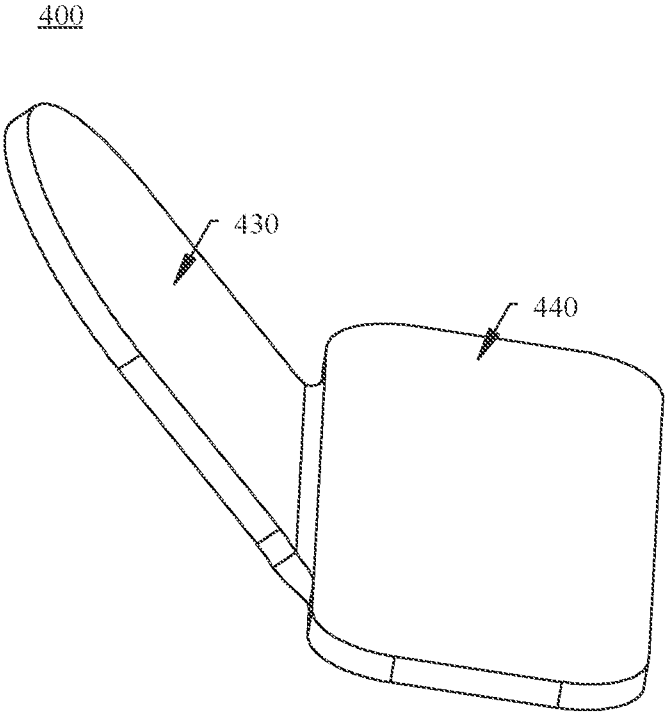
FIG. 9 is a diagram of a structure of a spring plate of the electronic device provided in FIG. 8.
Figure 10:
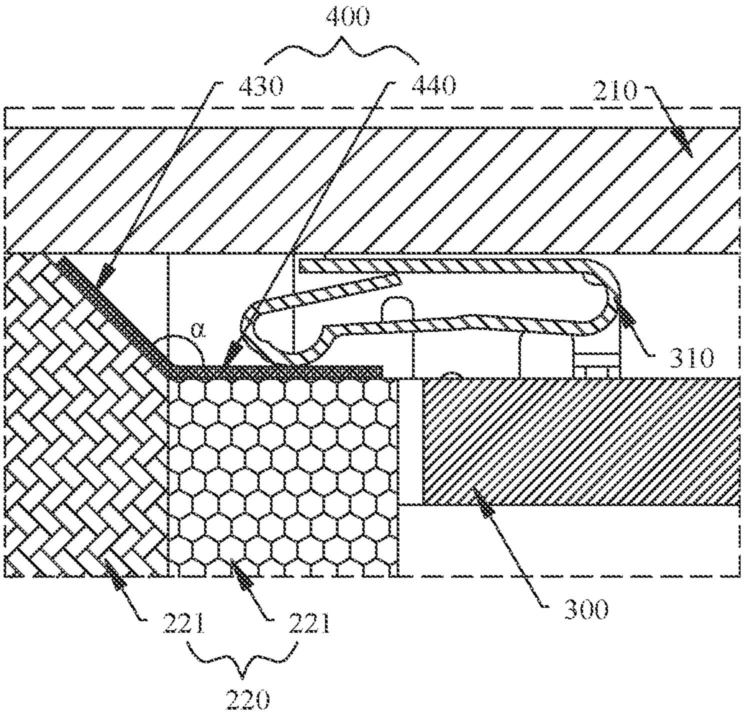
FIG. 10 is a partial cross-sectional view of a connection structure between the spring plate provided in FIG. 9, a bezel, and a mainboard.

To resolve the foregoing technical problems, refer to FIG. 8. FIG. 8 is an exploded diagram of another electronic device 10 according to an embodiment of this application. The electronic device 10 may include the foregoing display module 100, housing 200, mainboard 300, and spring plate 400. Refer to FIG. 9 and FIG. 10. FIG. 9 is a diagram of a structure of a spring plate 400 of the electronic device 10 provided in FIG. 8. FIG. 10 is a partial cross-sectional view of a connection structure between the spring plate 400 provided in FIG. 9, a bezel 220, and a mainboard 300. The spring plate 400 may include a welding portion 430 and a contact portion 440. The welding portion 430 is bonded to and fixed, by welding, to the metal portion 221, the contact portion 440 may be fixed to the plastic portion 222 through fixing by gluing, and the contact portion 440 abuts against the foregoing elastic piece 310, so that the contact portion 440 is electrically connected to the mainboard 300.

In addition, the contact portion 440 and the mainboard 300 are disposed parallel to each other. An included angle α is formed between the welding portion 430 and the contact portion 440. The included angle α is an obtuse angle or an acute angle. In other words, the welding portion 430 of the spring plate 400 forms the angle with parallel to the mainboard 300, that is, is obliquely disposed.

In addition, the spring plate 400 may be made of metal copper. The metal copper has good electrical conductivity. Therefore, reliability of electrical connection between the mainboard 300 and the metal portion 221 can be improved. Alternatively, the spring plate 400 may be made of another metal material with good conductivity. Therefore, this is not particularly limited in this application.

In addition, the spring plate 400 may be formed by bending a flat substrate to form the welding portion 430 and the contact portion 440, and the included angle α is formed between the welding portion 430 and the contact portion 440.

In this way, the welding portion 430 is obliquely disposed. One the one hand, this helps ensure that the requirement of the minimum welding length for the spot welding can be met when the welding portion 430 is welded to the metal portion 221; on the other hand, there is no need to increase a thickness dimension of the electronic device 10, that is, meeting the strength requirement of the spot welding by increasing the internal thickness space of the housing 200 helps lightness and thinning of the electronic device 10.

Figure 11:
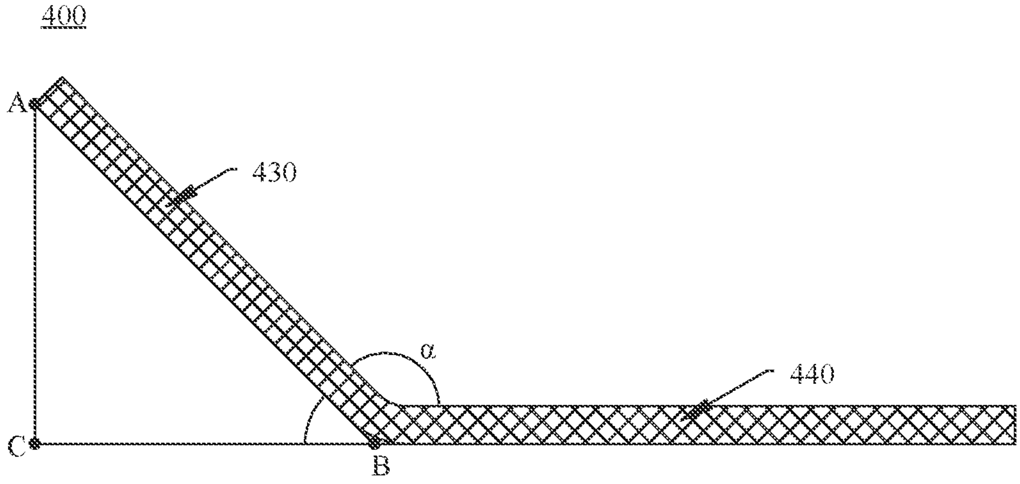
FIG. 11 is a diagram of a right triangle constructed by the spring plate provided in FIG. 9.

Specifically, a right triangle may be constructed. Refer to FIG. 11. FIG. 11 is a diagram of a right triangle constructed by the spring plate 400 provided in FIG. 9. An edge AB of a welding portion 430 is a hypotenuse of the right triangle, from an apex A of the welding portion 430 away from the contact portion 440 to a perpendicular line (where a perpendicular foot is C) to a plane on which the contact portion 440 is located is a catheti AC, and a connection line between an intersection (a point B) between the contact portion 440 and the welding portion 430 and the perpendicular foot is the other catheti BC. In this way, the right triangle is constructed.

It can be learned from FIG. 11 that, a larger catheti AC requires a larger thickness space of the electronic device 10, that is, a larger thickness dimension of the electronic device 10. According to the principle that a hypotenuse of a right triangle is the longest, when a length of the catheti AC is unchanged, an angle of an angle ABC may be reduced, so that a length of the hypotenuse AB is increased. That is, without increasing the thickness dimension of the electronic device 10, a length of the welding portion 430 can be increased provided that an angle of an included angle α between the welding portion 430 and the contact portion 440 is increased, thereby meeting a requirement of a minimum welding length between the welding portion 430 and the metal portion 221 while ensuring lightness and thinning of the electronic device 10.

In addition, the smaller the thickness space of the electronic device 10 (that is, the smaller the catheti AC), the length of the welding portion 430 (that is, the hypotenuse AB) can be increased by increasing the angle of the included angle α. This more helps lightness and thinning of the electronic device 10 while ensuring welding strength between the spring plate 400 and the metal portion 221.

It may be understood that, when the included angle α is an obtuse angle, the length of the welding portion 430 can be increased by increasing the angle of the included angle α. When the included angle α is an acute angle, the smaller the angle of the included angle α, the longer the length of the welding portion 430. The principle is the same as the foregoing principle. Therefore, the description is not repeated.

In some embodiments, when the included angle α is the acute angle, in a direction parallel to the mainboard 300, the welding portion 430 needs to extend toward the inside of the housing 200. To prevent the welding portion 430 from conflicting with other electronic components (for example, the mainboard 300 and the elastic piece 310 fixedly disposed on the mainboard 300) inside the electronic device 10, affecting a spatial layout, in the spring plate 400 provided in this application, the included angle α formed between the welding portion 430 and the contact portion 440 is the obtuse angle. For example, the included angle α may be 95°, 100°, 110°, 120°, 130°, 135°, 140°, 150°, 160°, 170°, 175°, or the like.

In addition, to facilitate processing of the spring plate 400, the included angle α may use some integer degrees, for example, 120°, 135°, and 150°, commonly used in the process. That is, degrees of the angle ABC are 60°, 45°, and 30°. In this way, on the one hand, these angles are commonly used processing parameters in the process, and processing is convenient; on the other hand, these angles are common angles, and this helps improve processing precision.

Figure 12:
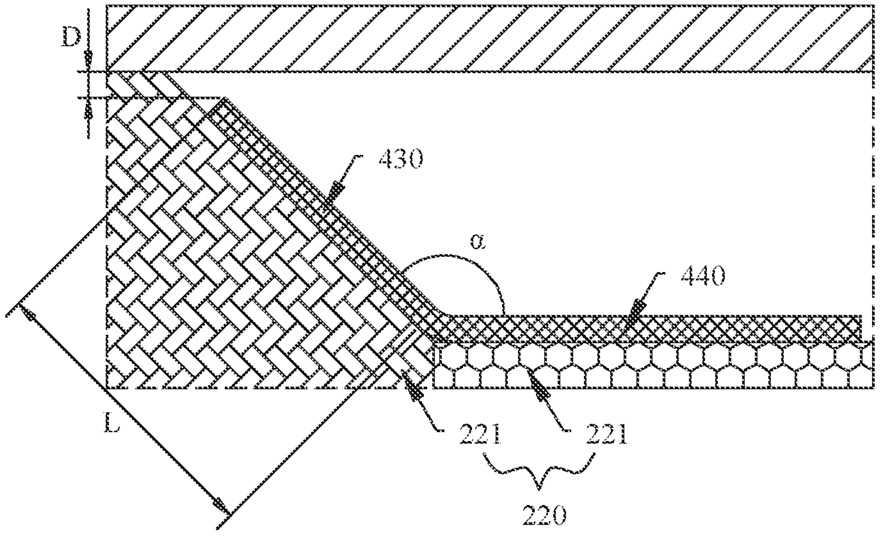
FIG. 12 is a partial cross-sectional view of a connection structure between the spring plate provided in FIG. 10, a bezel, and a back cover.

Refer to FIG. 12. FIG. 12 is a partial cross-sectional view of a connection structure between the spring plate 400 provided in FIG. 10, a bezel 220, and a back cover 210. To ensure reliability of welding between a welding portion 430 and a metal portion 221, in a direction in which a contact portion 440 points toward the welding portion 430 and is parallel to the welding portion 430, a length of the welding portion 430 (that is, the hypotenuse AB shown in FIG. 11) that is bonded to and fixed, by welding, to the metal portion 221 is L. Welding strength can be ensured when a minimum welding length for the welding between the welding portion 430 and the metal portion 221 is 1 mm. Therefore, L≥1 mm. In this way, the welding strength between the welding portion 430 and the metal portion 221 can be ensured. For example, the length L may be 1 mm, 1.05 mm, 1.08 mm, 1.1 mm, 1.13 mm, 1.15 mm, 1.18 mm, 1.2 mm, 2 mm, 3 mm, or the like. In this way, the reliability of the welding between the welding portion 430 and the metal portion 221 can be met without increasing a thickness dimension of the electronic device 10.

In addition, to further improve reliability of a whole structure, there is a gap between an edge of the welding portion 430 away from the contact portion 440 and the back cover 210. In this way, the welding portion 430 and the back cover 210 can be prevented from abutting against each other, to avoid mutual interference between the two, affecting structural strength, thereby helping improve reliability of the whole structure.

For example, the gap between the edge of the welding portion 430 away from the contact portion 440 and the back cover 210 is D. The gap D may be 0.1 mm, 0.12 mm, 0.14 mm, 0.15 mm, 0.17 mm, 0.19 mm, 0.2 mm, 0.5 mm, 1 mm, or the like. In this way, the welding portion 430 of the spring plate 400 can be prevented from abutting against the back cover 210, thereby ensuring reliability of the whole structure.

Figure 13:
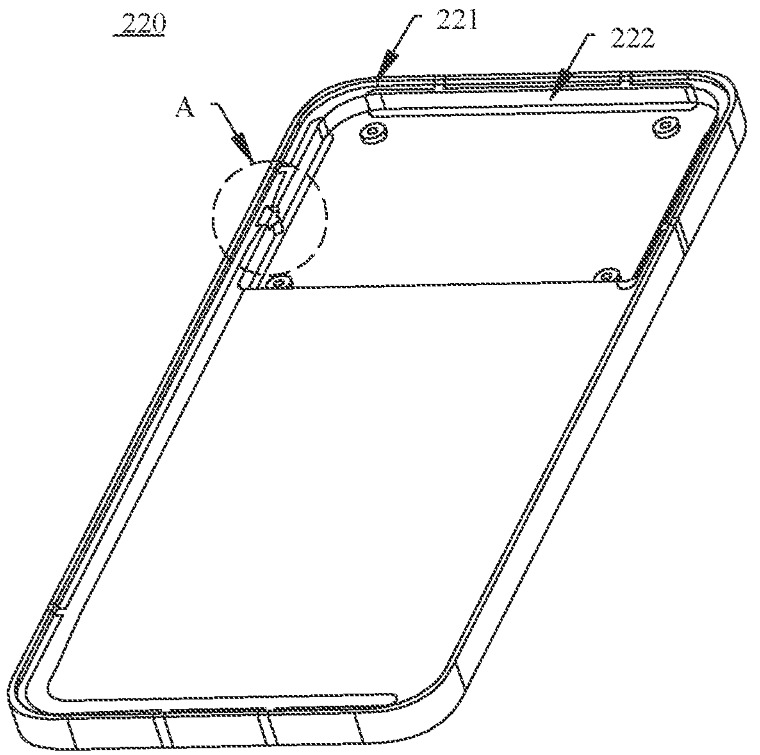
FIG. 13 is a diagram of a structure of a bezel of the electronic device provided in FIG. 8.
Figure 14:
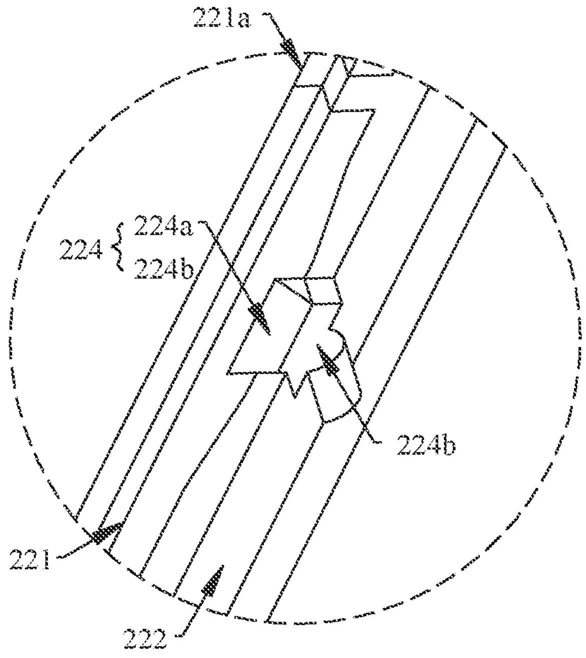
FIG. 14 is an enlarged view of a structure of an area A in FIG. 13.

Based on this, refer to FIG. 13 and FIG. 14. FIG. 13 is a diagram of a structure of a bezel 220 of an electronic device 10 provided in FIG. 8. FIG. 14 is an enlarged view of a structure of an area A in FIG. 13. An accommodating groove 224 may be provided on the bezel 220. The accommodating groove 224 is configured to accommodate the foregoing spring plate 400. Specifically, the accommodating groove 224 includes a first portion 224*a* and a second portion 224*b*. The first portion 224*a* is located on the metal portion 221, and the second portion 224*b* is located on the plastic portion 222. A bonding inclined surface is formed inside the first portion 224*a*. The bonding inclined surface and the welding portion 430 are parallel to each other. The welding portion 430 is bonded to and fixed, by spot welding, to the bonding inclined surface. A groove bottom of the second portion 224*b* is parallel to the mainboard 300. A contact portion 440 is disposed in the second portion 224*b*, and is fixed to the second portion 224*b* through fixing by gluing. In this way, the accommodating groove 224 for accommodating the spring plate 400 can be formed on the bezel 220. The spring plate 400 on the mainboard 300 may abut against the contact portion 440, so that the mainboard 300 forms a closed loop with the metal portion 221 and an antenna.

In addition, the welding portion 430 extends away from the mainboard 300. This can avoid an abutting conflict between the welding portion 430 and the elastic piece 310 or another component on the mainboard 300, and help improve utilization of internal space of the housing 200.

In addition, there may be one or more spring plates 400. A specific quantity may be determined based on an actual situation and a specific requirement of the electronic device 10. Therefore, this is not particularly limited in this application.

Figure 15:
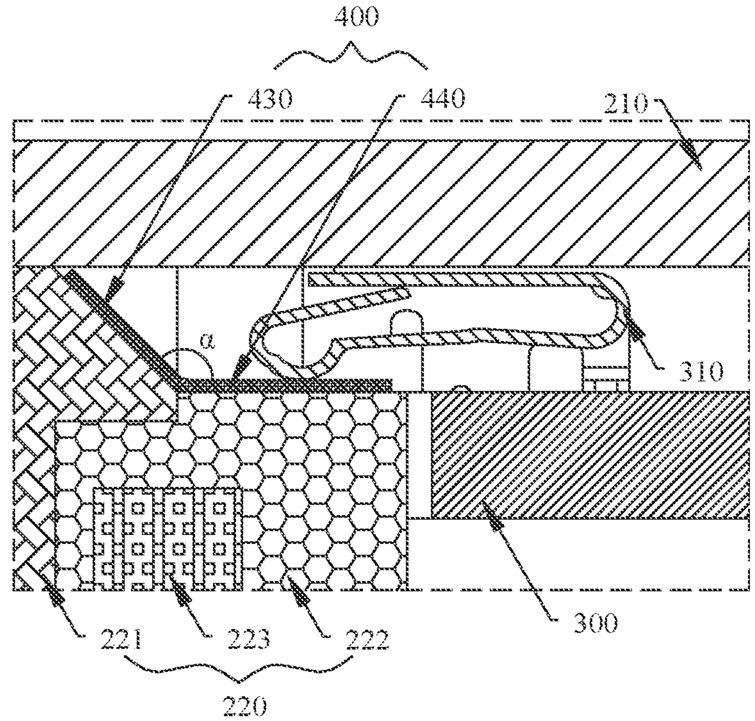
FIG. 15 is a cross-sectional view of a connection structure between another bezel, a spring plate, and a mainboard according to an embodiment of this application.

Based on this, because a plurality of notches 221*a* are provided on the metal portion 221, and the notches 221*a* are filled with the plastic portion 222, a signal transmitted by the antenna can be propagated outward. To improve strength at the notch 221*a* on the metal portion 221, refer to FIG. 15. FIG. 15 is a cross-sectional view of a connection structure between another bezel 220, a spring plate 400, and a mainboard 300 according to an embodiment of this application. The bezel 220 further includes a reinforcing block 223.

Specifically, the reinforcing block 223 may be made of a metal material. The reinforcing block 223 is embedded in a plastic portion 222, and is disposed in an area that is in the plastic portion 222 and that corresponds to a notch 221*a* on a metal portion 221, so that strength at the notch 221*a* can be compensated for, thereby improving overall strength of the bezel 220.

For example, the reinforcing block 223 may be made of an iron material. Because metal iron has relative high hardness, the strength at the notch 221*a* of the metal portion 221 can be supplemented, thereby improving the overall strength of the bezel 220. In addition, the reinforcing block 223 may alternatively be made of another metal material with relative high hardness. Therefore, this is not particularly limited in this application.

In some embodiments, a vertical projection of the spring plate 400 on a back cover 210 coincides with at least part of a vertical projection of the reinforcing block on the back cover 210. In other words, electrical connection points between the mainboard 300 and the metal portion 221 overlap each other. In this case, the spring plate 400 and the reinforcing block 223 may be disposed in an overlapping manner in a plane parallel to the back cover 210.

For example, still refer to FIG. 15. The reinforcing block 223 may be disposed on a side of the spring plate 400 away from the back cover 210. Because a welding portion 430 of the spring plate 400 is obliquely disposed, a distance between a contact portion 440 of the spring plate 400 and the back cover 210 may be reduced, and a thickness space on a side of the spring plate 400 away from the back cover 210 can be increased. In this way, a thickness dimension of the reinforcing block 223 can be increased, to further improve strength of the reinforcing block 223, thereby helping improve overall strength of a middle frame.

Figure 16:
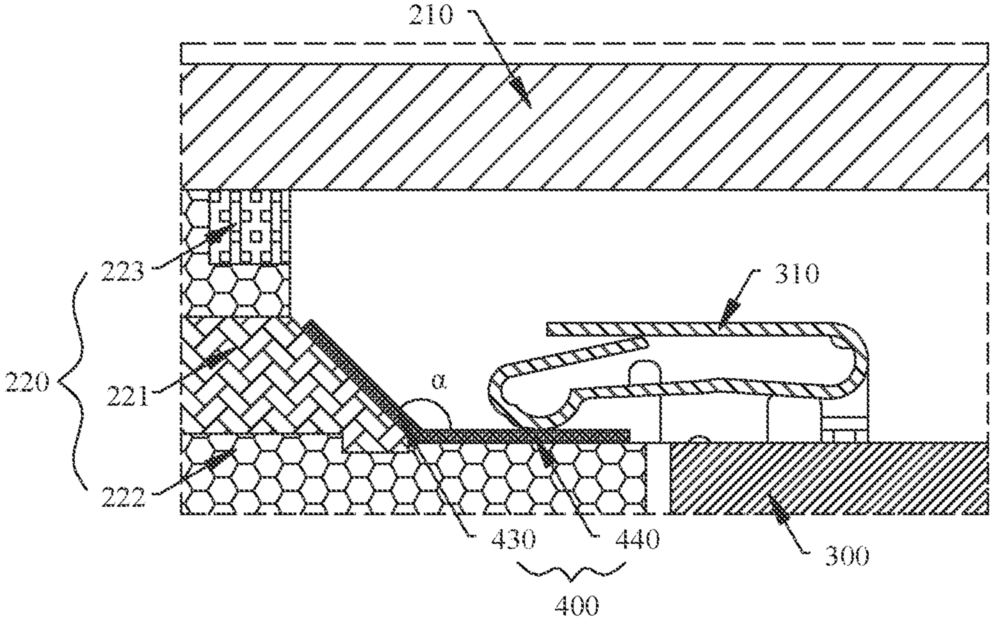
FIG. 16 is a cross-sectional view of a connection structure between still another bezel, a spring plate, and a mainboard according to an embodiment of this application.

Alternatively, refer to FIG. 16. FIG. 16 is a cross-sectional view of a connection structure between still another bezel 220, a spring plate 400, and a mainboard 300 according to an embodiment of this application. The foregoing reinforcing block 223 may alternatively be disposed on a side of the spring plate 400 close to a back cover 210. In other words, the reinforcing block 223 is disposed between the spring plate 400 and the back cover 210. In this way, because the reinforcing block 223 is disposed between the spring plate 400 and the back cover 210, a distance between an edge of a welding portion 430 of the spring plate 400 away from a contact portion 440 and the back cover 210 is increased, to further ensure that the welding portion 430 of the spring plate 400 and the back cover 210 do not abut against each other, thereby avoiding mutual interference between the spring plate 400 and the back cover 210, and helping protect components intact.

In the descriptions of this specification, the specific features, structures, materials, or characteristics may be combined in a proper manner in any one or more of the embodiments or examples.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be used as a protection scope of the claims.

The invention claimed is:

1. An electronic device, comprising:
- a housing, comprising:
  - a bezel; and
  - a back cover fixedly connected to the bezel;
- a mainboard disposed in the housing; and
- a spring plate, comprising:
  - a welding portion bonded to and fixed, by welding, to the bezel; and
  - a contact portion that is electrically connected to the mainboard, wherein the contact portion is parallel to the mainboard, an included angle $\alpha$ is formed between the welding portion and the contact portion, and the included angle $\alpha$ is an obtuse angle or an acute angle.

2. The electronic device of claim 1, wherein the welding portion is provided on a side of the contact portion close to the back cover.

3. The electronic device of claim 1, wherein the included angle $\alpha$ formed between the welding portion and the contact portion is the obtuse angle.

4. The electronic device of claim 3, wherein the included angle $\alpha$ is 120°, 135°, or 150°.

5. The electronic device of claim 1, wherein in a direction in which the contact portion points toward the welding portion and is parallel to the welding portion, a length of the welding portion that is bonded to and fixed, by welding, to the bezel is L, and $L \geq 1$ mm.

6. The electronic device of claim 1, wherein a gap exists between an edge of the welding portion away from the contact portion and the back cover.

7. The electronic device of claim 1, wherein the bezel comprises a metal portion and a plastic portion, the welding portion is bonded to and fixed, by welding, to the metal portion, the contact portion is fixed to the plastic portion, at least one notch is formed on an outer wall of the metal portion, and a part of the plastic portion extends into the notch.

8. The electronic device of claim 7, wherein the bezel further comprises a reinforcing block that is embedded in the plastic portion, and the reinforcing block is configured to reinforce strength at the notch.

9. The electronic device of claim 8, wherein a vertical projection of the reinforcing block on the back cover coincides with at least part of an area of a vertical projection of the spring plate on the back cover.

10. The electronic device of claim 8, wherein the reinforcing block is disposed on a side of the spring plate away from the back cover.

11. The electronic device of claim 8, wherein the reinforcing block is disposed on a side of the spring plate close to the back cover.

12. The electronic device of claim 8, wherein the reinforcing block is made of a metal material.

13. The electronic device of claim 1, further comprising an elastic piece, wherein one end of the elastic piece is fixed to the mainboard, and another end of the elastic piece abuts the contact portion.

14. The electronic device of claim 2, wherein in a direction in which the contact portion points toward the welding portion and is parallel to the welding portion, a length of the welding portion that is bonded to and fixed, by welding, to the bezel is L, and $L \geq 1$ mm.

15. The electronic device of claim 14, wherein a gap exists between an edge of the welding portion away from the contact portion and the back cover.

16. The electronic device of claim 15, wherein the bezel comprises a metal portion and a plastic portion, the welding portion is bonded to and fixed, by welding, to the metal portion, the contact portion is fixed to the plastic portion, at least one notch is formed on an outer wall of the metal portion, and a part of the plastic portion extends into the notch.

17. The electronic device of claim 16, further comprising an elastic piece, wherein one end of the elastic piece is fixed to the mainboard, and another end of the elastic piece abuts the contact portion.

18. The electronic device of claim 16, wherein the bezel further comprises a reinforcing block that is embedded in the plastic portion, and the reinforcing block is configured to reinforce strength at the notch.

19. The electronic device of claim 18, wherein a vertical projection of the reinforcing block on the back cover coincides with at least part of an area of a vertical projection of the spring plate on the back cover.

20. The electronic device of claim 19, wherein the reinforcing block is made of a metal material.

* * * * *